(12) United States Patent
Byeon et al.

(10) Patent No.: US 7,417,475 B2
(45) Date of Patent: Aug. 26, 2008

(54) CIRCUIT AND METHOD FOR GENERATING POWER UP SIGNAL

(75) Inventors: Sang-Jin Byeon, Ichon-shi (KR); Kee-Teok Park, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 243 days.

(21) Appl. No.: 11/320,846

(22) Filed: Dec. 30, 2005

(65) Prior Publication Data

US 2006/0220709 A1 Oct. 5, 2006

(30) Foreign Application Priority Data

Mar. 31, 2005 (KR) .................. 10-2005-0027406

(51) Int. Cl.
*H03L 7/00* (2006.01)

(52) U.S. Cl. .................................... 327/143; 327/198

(58) Field of Classification Search ............... 327/142, 327/143, 198
See application file for complete search history.

(56) References Cited

U.S. PATENT DOCUMENTS

| 5,898,635 | A | 4/1999 | Raad et al. | |
| 6,492,850 | B2* | 12/2002 | Kato et al. | 327/143 |
| 6,642,757 | B2* | 11/2003 | Ikehashi et al. | 327/143 |
| 6,657,903 | B2 | 12/2003 | Sung | |
| 6,885,605 | B2* | 4/2005 | Lee et al. | 365/226 |
| 2002/0140468 | A1* | 10/2002 | Kato et al. | 327/143 |
| 2005/0104571 | A1 | 5/2005 | Byeon et al. | |
| 2005/0141287 | A1 | 6/2005 | Do | |
| 2006/0103437 | A1* | 5/2006 | Kang | 327/143 |
| 2006/0284655 | A1* | 12/2006 | Li et al. | 327/143 |

FOREIGN PATENT DOCUMENTS

| JP | 10-199260 A | 7/1998 |
| KR | 2003-0089878 | 11/2003 |

* cited by examiner

*Primary Examiner*—N. Drew Richards
*Assistant Examiner*—William Hernandez
(74) *Attorney, Agent, or Firm*—McDermott Will & Emery LLP

(57) ABSTRACT

There is provided a circuit and a method for generating a power up signal. The circuit for generating a power up signal, includes an external power voltage divider for dividing a magnitude of an external power voltage so as to output the divided voltage, an external power voltage detector for activating a detection signal when the output voltage of the external power voltage divider reaches a preset level, and a power up signal generator for outputting a power up signal according to the detection signal and a first internal power voltage. Herein, the power up signal is generated when the internal power voltage as well as the external power voltage reaches a sufficient level so that a power up signal skew may be reduced to stabilize its operation and enhance reliability of a device.

13 Claims, 7 Drawing Sheets

CIRCUIT AND METHOD FOR GENERATING POWER UP SIGNAL

FIELD OF THE INVENTION

The present invention relates to a circuit and a method for generating a power up signal; and more particularly, to a circuit and a method for generating a power up signal, in which the power up signal is generated after both levels of an external power and an internal power are stabilized enough by using the internal power as well as the external power.

DESCRIPTION OF RELATED ART

A power up circuit generates a power up signal after detecting whether a bulk bias voltage Vbb has secured a desired level or not. In addition, the power up circuit controls a semiconductor device till internal power voltages are stabilized to predetermined levels and a set-up operation is completely done.

In general, a DRAM chip has a predetermined threshold voltage Vt in virtue of a PMOS transistor and an NMOS transistor incorporated therein while an external power voltage Vext rises up from 0 V to a target level. Therefore, an operational range of the DRAM chip becomes stabilized in case that the level of the external power voltage Vext becomes a summation of the threshold voltages of the PMOS transistor and the NMOS transistor, i.e., 2Vt. An electric potential of the internal power voltage generated by the external power voltage Vext should be beyond a predetermined level in order that the chip may be stably operated. In order to control this operation, it is very important to maintain an enabling point of the power up signal to be uniform in an aspect of stabilizing the chip.

FIG. 1 is a circuit diagram setting forth a constitution of a first conventional apparatus for generating a power up signal.

Referring to FIG. 1, the first conventional apparatus for generating a power tip signal includes an external power voltage divider 1, a level controller 2, a power up signal generator 3 and a buffer 4.

The external power voltage divider 1 divides the external power voltage Vext by a predetermined ratio according to a resistance ratio between resistors R1 and R2 connected to each other in series between the external power voltage Vext and a ground voltage Vss. Thereafter, the external power voltage divider 1 outputs the divided voltage so that it detects a variation of the external power voltage Vext. The level controller 2 controls an output voltage level of the external power voltage divider 1 by driving a reverse bias NMOS diode N1 when the output voltage of the external power voltage divider 1 exceeds to a predetermined level. The power up signal generator 3 is provided with a PMOS transistor P1 and an NMOS transistor N2 connected to each other in series between the external power voltage Vext and the ground voltage Vss. The NMOS transistor N2 receives the output voltage of the external power voltage divider 1 through a gate thereof, and generates a detection signal det if the output voltage of the external power voltage divider 1 reaches a predetermined level, i.e., a threshold voltage of the NMOS transistor N2. The buffer 4 having an inverter IV1 outputs a power up signal pwrup after buffering the detection signal det to a predetermined level.

An operation of the first conventional apparatus for generating the power up signal will be set forth in detail as followings.

Provided that a magnitude of the external power voltage Vext rises up as time goes by after the external power voltage Vext is applied, a voltage of a node A also rises up. At this time, the output voltage det level of the power up signal generator 3 rises up to become in logic high level due to the increase of the external power voltage Vext so that the power up signal pwrup maintains to be in logic low level. Afterwith the lapse of time, if the voltage of the node A reaches the threshold voltage of the NMOS transistor N2, the NMOS transistor N2 is turned on so that the output voltage det of the power up signal generator 3 becomes in logic low level. Accordingly, the power up signal pwrup is activated to be in logic high level.

However, the first conventional apparatus for generating the power up signal generates the power up signal pwrup after detecting whether or not only the external power voltage Vext reaches a predetermined level.

Provided the external power voltage Vext becomes unstable because of a noise or the like, the internal power voltage becomes unstable also. At this time, a recovery for the external power voltage Vext can be rapidly done by driving a large driver out of the chip but a recovery for the internal voltage is very slow because only small driver is incorporated in the chip.

In this case, if the chip informs a normalization of an operation by generating the power up signal pwrup after detecting only the recovered external power voltage Vext, the chip has many problems in viewpoint of stabilization at an initial operation state and a reliability of the chip because the internal power voltage has not been recovered yet.

FIGS. 2 and 3 are circuit diagrams illustrating constitutions of a second and third conventional apparatuses for generating power up signals. In comparison with the first conventional apparatus of FIG. 1, external power voltage dividers 5 and 7 and a buffer 6 are different from those in the first conventional apparatus of FIG. 1.

That is, in the second conventional apparatus of FIG. 2, an NMOS diode ND is used instead of the resistor R2 of FIG. 1. In addition, a bipolar junction transistor (BJT) diode BD is used for the third conventional apparatus instead of the resistor R1. Even though there is another inverter IV2 as well as the inverter IV1, the operational mechanism is similar to that of the first apparatus so that the second and the third conventional apparatuses have the same problem like the first conventional one.

SUMMARY OF THE INVENTION

It is, therefore, an object of the present invention to provide a circuit for generating a power up signal, wherein a circuit design is improved to reduce a variation degree of a power up signal using level states of an internal power voltage as well as an external power voltage and further enhance a reliability of a device by stably operating a DRAM.

In accordance with an aspect of the present invention, there is provided a circuit for generating a power up signal, including: an external power voltage divider for dividing a magnitude of an external power voltage so as to output the divided voltage; an external power voltage detector for activating a detection signal when the output voltage of the external power voltage divider reaches a preset level; and a power up signal generator for outputting a power up signal according to the detection signal and a first internal power voltage.

In accordance with another aspect of the present invention, there is provided a method for generating a power signal, including the steps of: a) dividing an external power voltage by a predetermined ratio; b) generating a detection signal when the divided external power voltage reaches a preset level; and c) activating a power up signal in case that both the detection signal and an internal power voltage reach a preset level.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
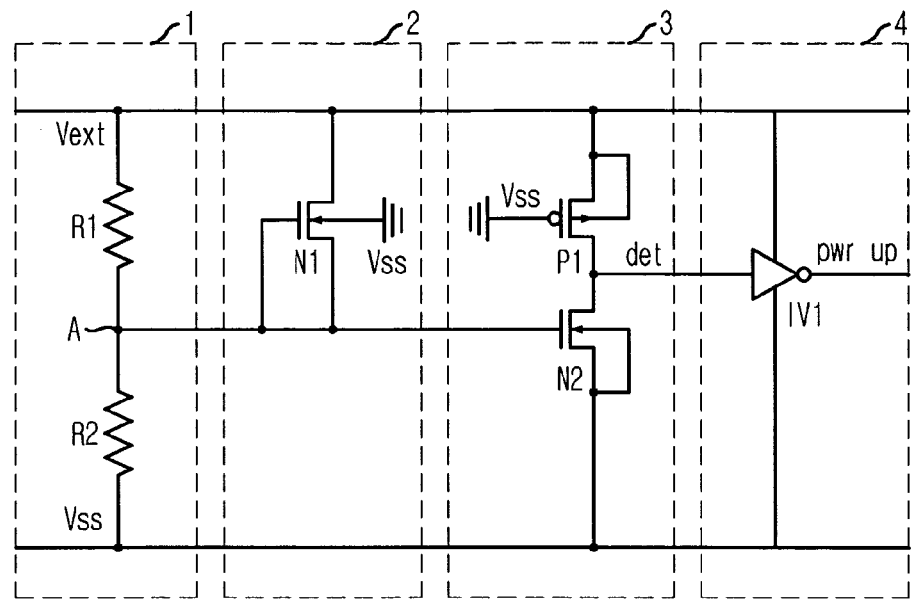
FIG. 1 is a circuit diagram setting forth a first conventional apparatus for generating a power up signal.
Figure 2:
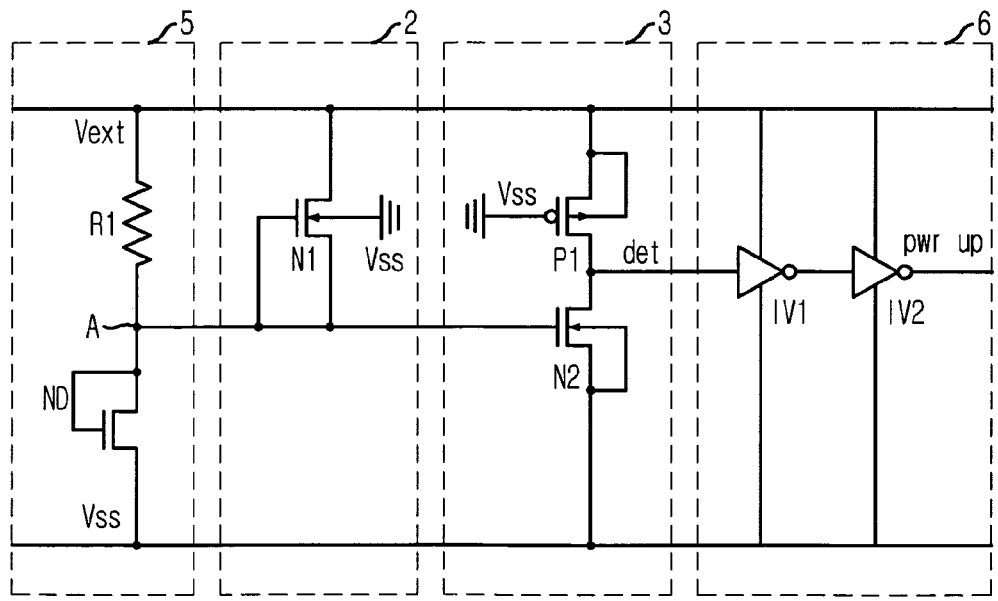
FIG. 2 is a circuit diagram setting forth a second conventional apparatus for generating a power up signal.
Figure 3:
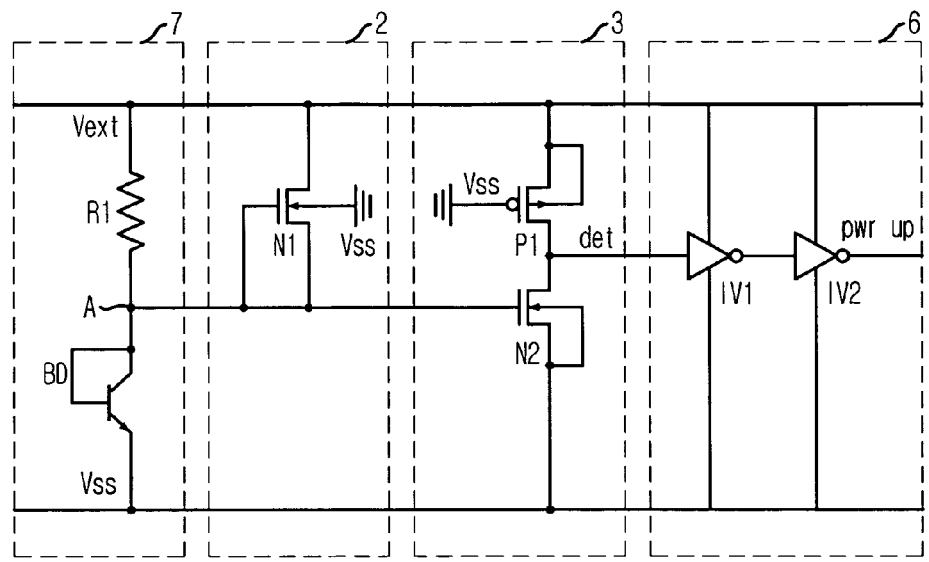
FIG. 3 is a circuit diagram setting forth a third conventional apparatus for generating a power up signal.
Figure 4:
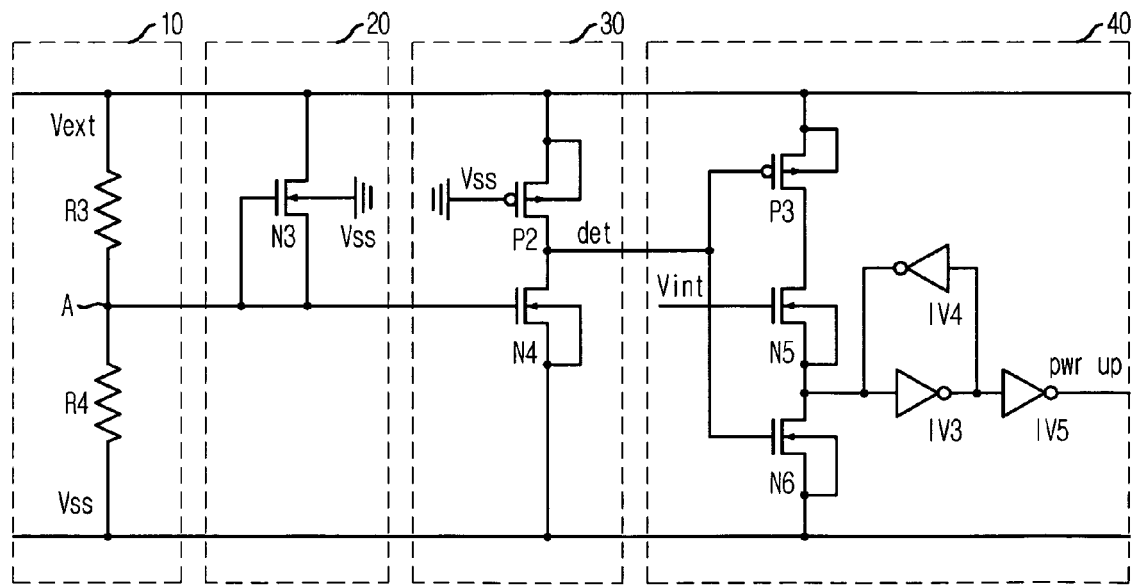
FIG. 4 is a circuit diagram setting forth a circuit for generating a power up signal in accordance with a first embodiment of the present invention.

FIG. 4 is a circuit diagram setting forth a circuit for generating a power up signal in accordance with a first embodiment of the present invention.

Referring to FIG. 4, the circuit for generating a power up signal includes an external power voltage diver 10, a level controller 20, an external power voltage detector 30 and a power up signal generator 40.

The external power voltage divider 10 divides the external power voltage Vext of which a level rises up with the lapse of the time by a predetermined ratio so as to output the divided voltage to detect a magnitude variation of the external power voltage Vext. The external power voltage divider 10 is provided with resistors R3 and R4 to divide the external power voltage Vext according to a resistance ratio between the resistors R3 and R4. At this time, the output voltage of the external power voltage divider 10 becomes a value expressed as a following equation, i.e., R4/(R3+R4)*Vext.

The level controller 20 is operated if the output voltage of the external power voltage divider 10 reaches a predetermined value, thereby stabilizing the output voltage of the external power driver 10. A gate and a source of the level controller 20 is commonly connected to an output node A of the external power voltage divider 10, and a drain is connected to the external power voltage Vext. Furthermore, a ground voltage Vss is applied to a bulk so that the level controller 20 constitutes a reverse bias NMOS diode N3.

The external power voltage detector 30 receives the output voltage of the external power voltage divider 10 and detects whether or not the external power voltage Vext reaches the preset level, to thereby selectively activate the detection signal det. The external power voltage detector 30 is provided with a PMOS transistor P2 and an NMOS transistor N4 connected to each other in series between the external power voltage Vext and the ground voltage Vss. A gate of the PMOS transistor P2 is connected to the ground voltage Vss and a gate of the NMOS transistor N4 is connected to the output terminal of the external power voltage divider 10. That is, the external power voltage detector 30 outputs the detection signal det having the external power voltage Vext level until the output voltage of the external power voltage divider 10 reaches the threshold voltage of the NMOS transistor N4. Meanwhile, when the output voltage of the external power voltage divider 10 reaches the threshold voltage of the NMOS transistor N4, the external power voltage detector 30 lowers the level of the detection signal det to the ground voltage Vss level.

The power signal generator 40 receives the output voltage of the external power voltage detector 30 and an internal power voltage Vint, and then outputs the power up signal pwrup according to magnitudes of the detection signal det and the internal power voltage Vint. That is, the power up signal pwrup can be enabled after the level state of the internal power voltage Vint as well as the level state of the detection signal det detecting the magnitude of the external power voltage Vext are reflected in the power up signal generator 40. Therefore, provided that the magnitude of the internal power voltage Vint does not reach a stabilized level sufficiently although the magnitude of the external power voltage Vext becomes the predetermined level, the power up signal pwrup cannot be enabled in accordance with the present invention.

In detail, the power signal generator 40 is provided with a PMOS transistor P3, NMOS transistors N5 and N6 and inverters IV3, IV4 and IV5. The PMOS transistor P3 is connected between the external power voltage Vext and the NMOS transistor N5. A gate of the PMOS transistor P3 is commonly connected to a gate of the NMOS transistor N6 so that the PMOS transistor P3 receives the detection signal det of the external power voltage detector 30. The NMOS transistor N5 connected between the PMOS transistor P3 and the NMOS transistor N6, receives the internal power voltage Vint through a gate thereof. The NMOS transistor N6 is connected between the NMOS transistor N5 and the ground voltage Vss, of which a gate is commonly connected to the gate of the PMOS transistor P3 so that the NMOS transistor N6 also receives the detection signal det of the external power voltage detector 30. In the inverters IV3 and IV4, each of input terminals is connected to each of output terminals so as to form a latch structure which is connected to a node between the NMOS transistors N5 and N6. The inverter IV5 is connected to the output terminal of the inverter IV3 so as to output the power up signal pwrup.

An operation of the inventive apparatus for generating the power up signal will be set forth in detail hereinafter.

If the magnitude of the applied external power voltage Vext rises up more and more after with the lapse of time, the magnitude of the output voltage, i.e., R4/(R3+R4)*Vext, of the external power voltage divider 10 also rises up accordingly. At this time, as the external power voltage Vext is increased, the magnitude of the detection signal det receiving the external power voltage Vext through the PMOS transistor P2 is increased also so as to turn on the NMOS transistor N6. Thus, the power up signal pwrup maintains its logic low level.

However, when the magnitude of the external power voltage Vext reaches a predetermined level, i.e., a threshold voltage of the NMOS transistor N4, the NMOS transistor N4 is turned on so that the detection signal det becomes in the ground voltage level. Accordingly, the NMOS transistor N6 is turned on and the PMOS transistor P3 is turned off. But, if the internal power voltage Vint does not reach a sufficient level, i.e., the threshold voltage of the NMOS transistor N5, the NMOS transistor N5 is still turned off so that the power up signal pwrup keeps in logic low level by means of the latch circuit IV3 and IV4. When the magnitude of the internal power voltage Vint reaches the threshold voltage of the NNMOS transistor N5, the NMOS transistor is turned on so as to activate the power up signal pwrup to be in logic high level. In this way, the inventive apparatus for generating the power up signal activates the power up signal pwrup under the condition that the internal power voltage as well as the external power voltage reaches a sufficient level for stabilized operation of the chip.

Figure 5:
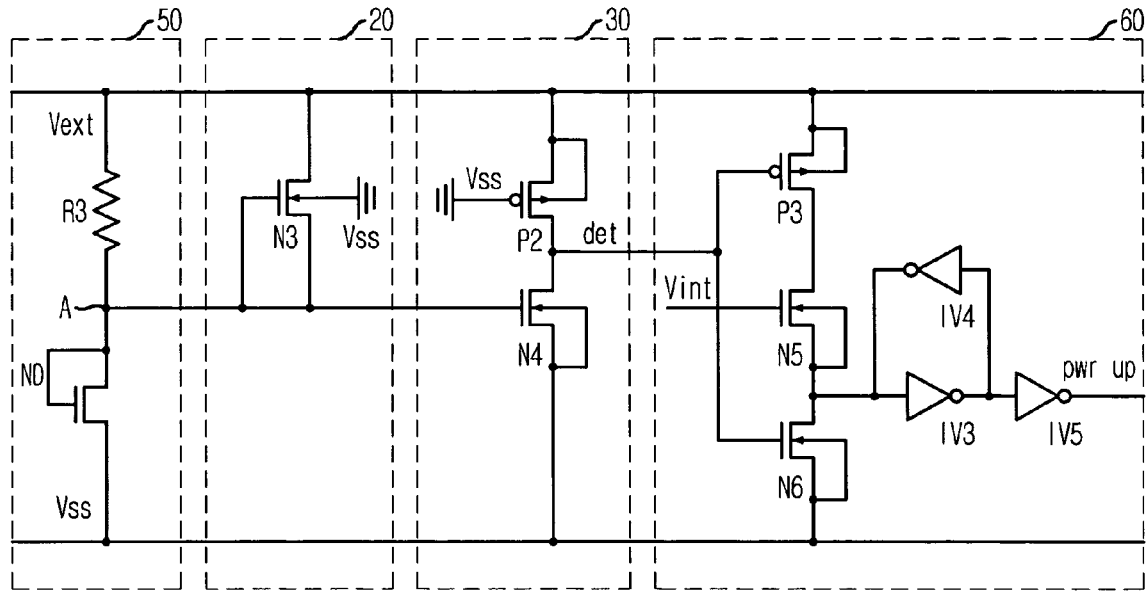
FIG. 5 is a circuit diagram setting forth a circuit for generating a power up signal in accordance with a second embodiment of the present invention.

FIG. 5 is a circuit diagram setting forth a circuit for generating a power up signal in accordance with a second embodiment of the present invention.

Referring to FIG. 5, in comparison with the circuit for generating the power up signal of the first embodiment, constitutions of an external power voltage divider 50 and a power up signal generator 60 are different from those in the first embodiment. That is, the external power voltage divider 50 of the second embodiment employs an NMOS diode ND instead of the resistor R4 for dividing the external power voltage Vext. In addition, the power up signal generator 60 further includes an inverter IV6 at an input terminal where the detection signal det is inputted. The other constitutions of the second embodiment are identical to those of the first embodiment so that like reference numerals in FIG. 5 denote like element in FIG. 4, and thus their descriptions will be omitted herein.

The power up signal generator 60 of the second embodiment activates the power up signal pwrup when the output signal of the external power voltage detector 30 is transited from low level to high level. That is, if the external power voltage Vext rises up, a voltage of a node A also rises up accordingly. If the voltage of the node A reaches a predetermined level, the NMOS transistor N4 is turned on so that the detection signal becomes in logic low level. Herein, if the external power voltage Vext rises up more and more, the NMOS diode ND is turned on and the NMOS transistor N4 is turned off. Accordingly, the detection signal det becomes in logic high level. At this time, if the internal power voltage Vint has a high level enough, the power up signal pwrup becomes activated to be in logic high level, to thereby operate the chip.

Therefore, in the apparatus of generating the power up signal in accordance with the second embodiment of the present invention, the magnitude of the external power voltage Vext enabling the power up signal pwrup to be in logic high level is not the threshold voltage of the NMOS transistor N4 but a predetermined voltage for turning on the NMOS diode ND.

Figure 6:
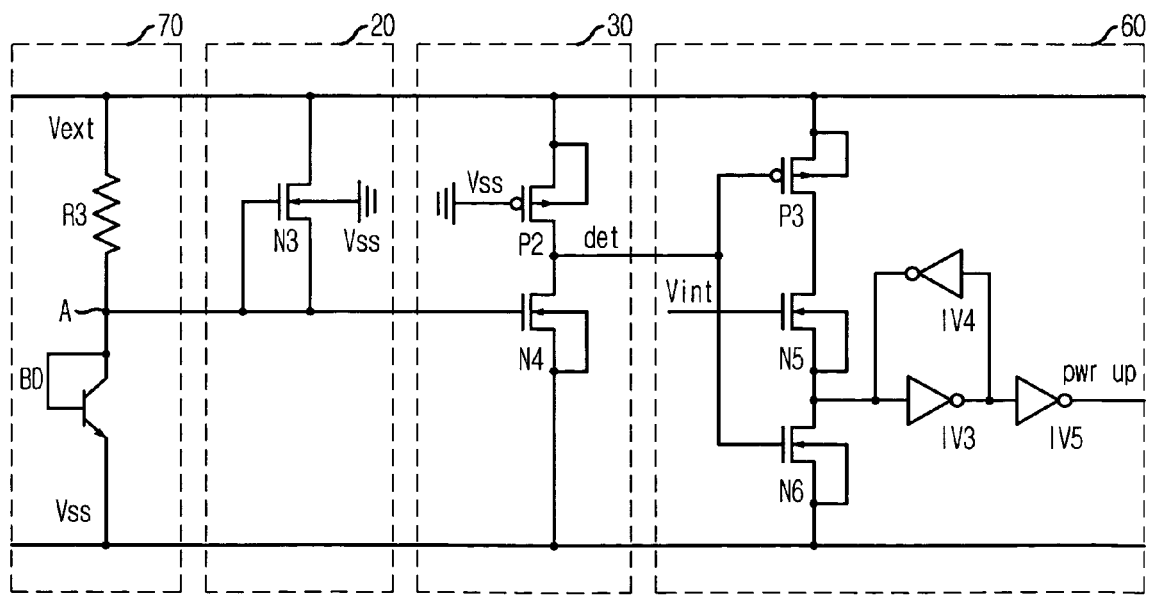
FIG. 6 is a circuit diagram setting forth a circuit for generating a power up signal in accordance with a third embodiment of the present invention.

FIG. 6 is a circuit diagram setting forth a circuit for generating a power up signal in accordance with a third embodiment of the present invention.

Referring to FIG. 6, elements and constitutions of the apparatus in accordance with the third embodiment are same with those of the second embodiment except that a bipolar junction transistor (BJT) diode BD is used instead of the NMOS diode ND. Therefore, its operational principle is also same with that of the second embodiment so that further detail descriptions will be omitted herein.

Figure 7:
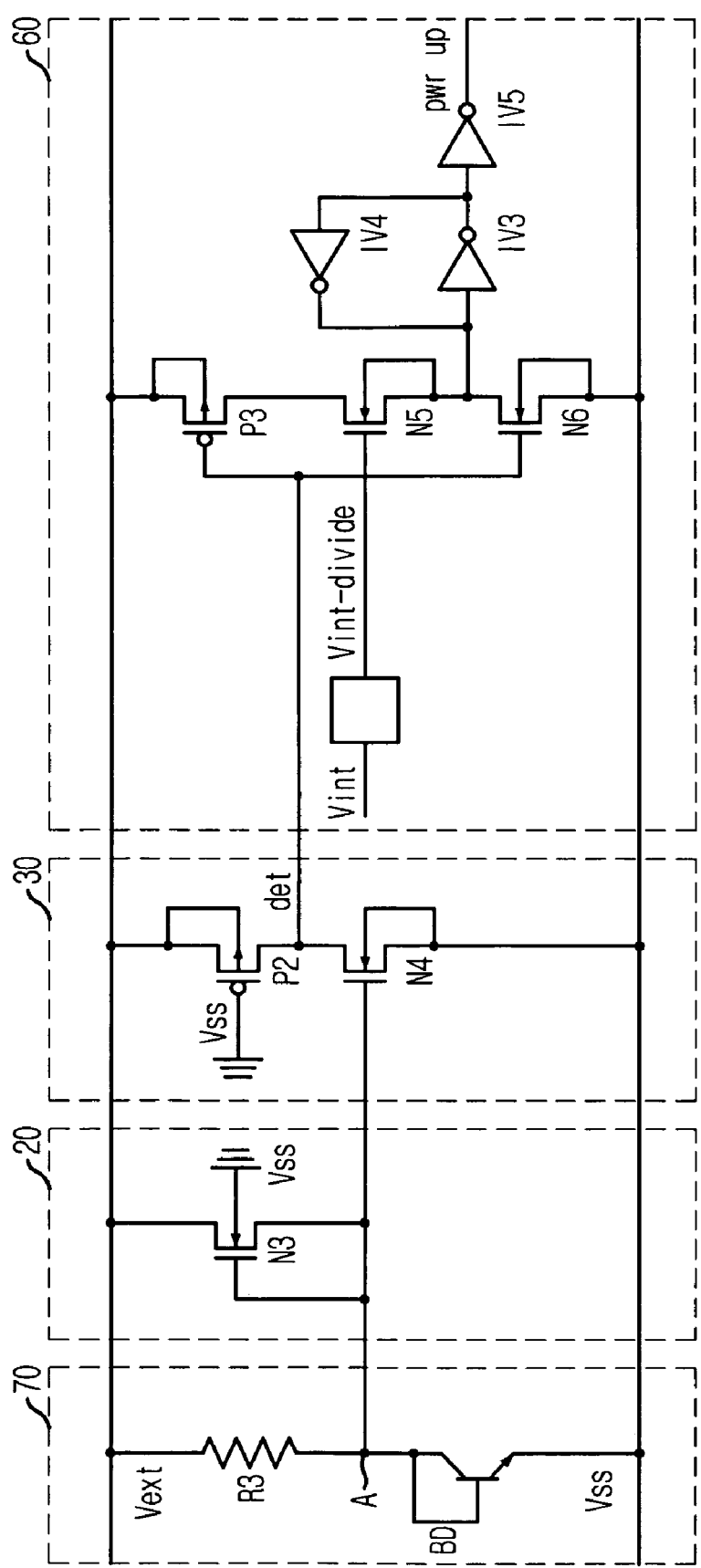
FIG. 7 is a circuit diagram setting forth a circuit for generating a power up signal in accordance with a fourth embodiment of the present invention.

FIG. 7 is a circuit diagram setting forth a circuit for generating a power up signal in accordance with a fourth embodiment of the present invention.

Referring to FIG. 7, in the circuit for generating a power up signal in accordance with a fourth embodiment, the internal power voltage Vint is not directly used but a divided internal power voltage Vint_divide is applied to a power up signal generator 60 through an internal power voltage divider 80 after dividing the magnitude of the internal power voltage Vint appropriately. Thus, it is possible to use higher internal power voltage Vint in the apparatus of the fourth embodiment in comparison with the apparatuses of the first to the third embodiments.

The circuit for generating a power up signal in accordance with a fourth embodiment, may further include the internal power voltage divider 80 disposed at an input terminal of the internal power voltage Vint for dividing the magnitude of the internal power voltage Vint and applying the divided internal power voltage Vint_divide to a gate of an NMOS transistor N5.

Although it is shown in FIG. 7 such that the circuit for generating the power up signal further includes the internal power voltage divider 80 in comparison with the apparatus of the first embodiment, it is obvious to those skilled in the art that the internal power voltage divider 80 may be applied to the apparatuses of the second and the third embodiments, also.

FIGS. 8A to 8E are circuit diagrams setting forth the internal voltage divider of FIG. 7 in accordance with various embodiments of the present invention.

Figure 8A:
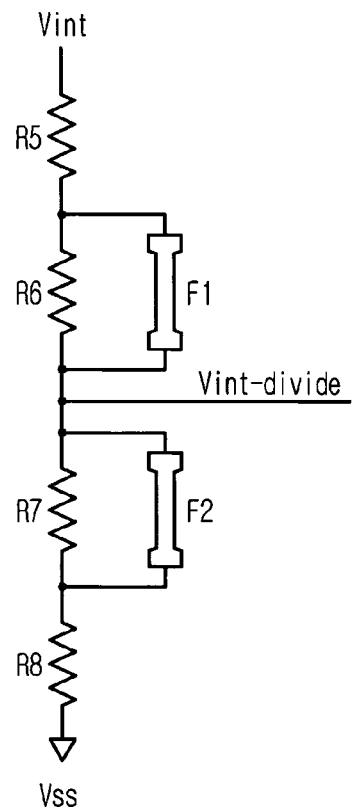
FIGS. 8A to 8E are circuit diagrams setting forth the internal voltage divider of FIG. 7 in accordance with embodiments of the present invention.
Figure 8B:
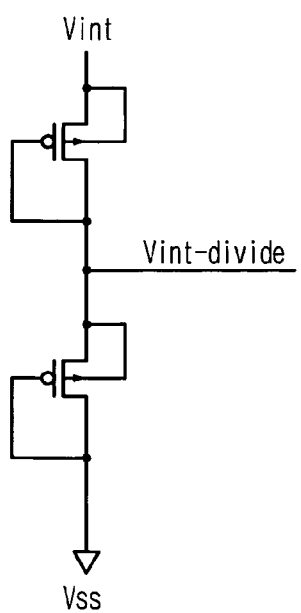
Figure 8C:
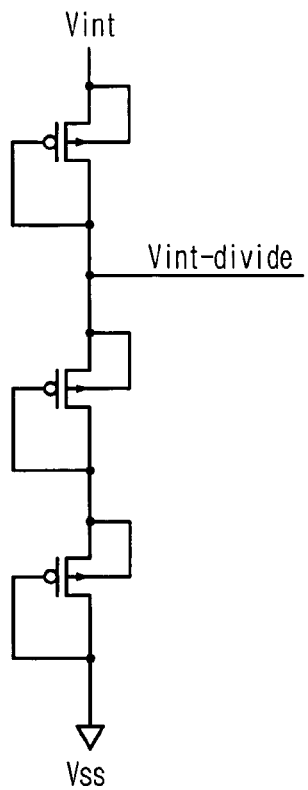
Figure 8D:
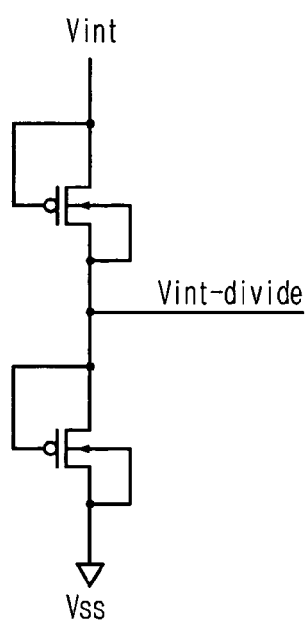
Figure 8E:
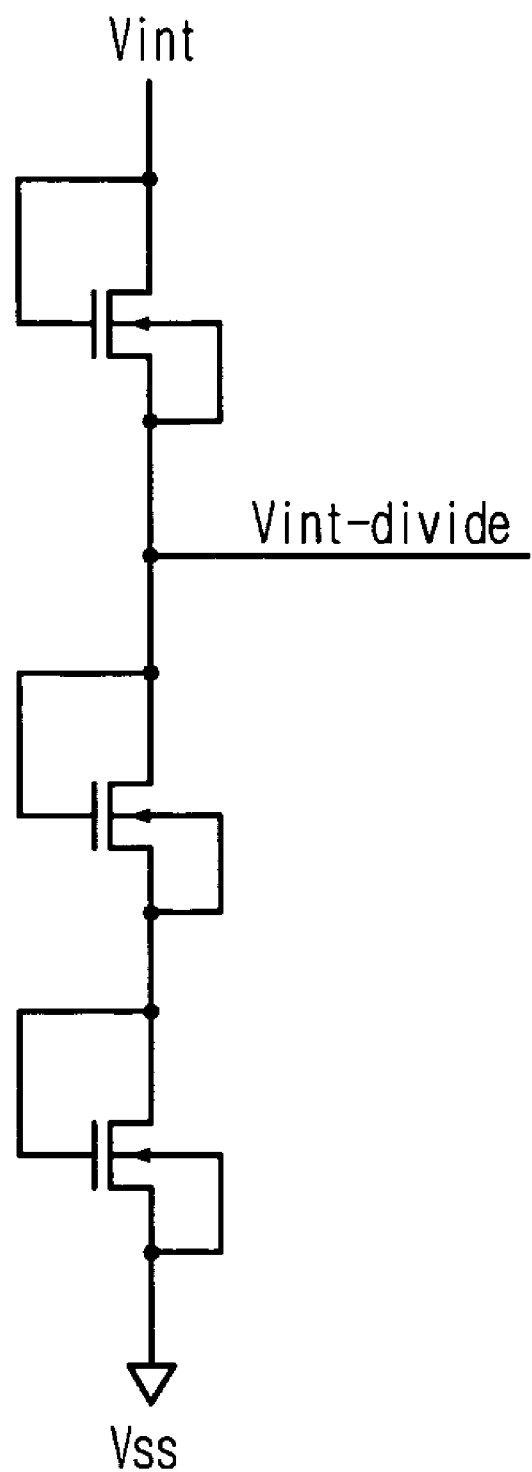

The internal power voltage divider 80 of FIG. 8A is configured with a plurality of resistors R5 to R8 connected in series. Herein, resistors R6 and R7 are connected to fuses F1 and F2 in parallel, respectively. Accordingly, it is possible to arbitrarily control the output voltage of the internal power voltage divider 80, i.e., the magnitude of the internal power voltage Vint_divide, by selectively shorting the fuse. While it is shown in FIG. 8A that the internal power voltage divider 80 employs four number of the resistor R5 to R8, it should not be construed as being limited to the embodiments set forth herein so that the number of the resistor may be altered if necessary.

Referring to FIGS. 8B to 8E, the internal power voltage divider 80 is configured with a plurality of PMOS diodes and a plurality of NMOS diodes connected in series between the internal power voltage Vint and the ground voltage Vss. In theses cases, it is possible to obtain a desired internal power voltage Vint_divide by controlling the number of the MOS transistor.

As described above, the circuit for generating the power up signal controls the generation of the power up signal by using the internal power voltage as well as the external power voltage, to thereby reduce a skew of the power up signal to stabilize its operation and enhance a reliability of a device.

The present application contains subject matter related to Korean patent application No. 2005-27406, filed in the Korean Intellectual Property Office on Mar. 31, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A circuit for generating a power up signal, comprising:
   an external power voltage divider for dividing a magnitude of an external power voltage so as to output the divided external power voltage;
   an external power voltage detector for activating a detection signal when the output voltage of the external power voltage divider reaches a preset level; and a power up signal generator for outputting a power up signal according to the detection signal and a first internal power voltage, wherein the power up signal generator includes an internal power voltage divider for dividing a second internal power voltage so as to output the divided second internal power as the first internal power voltage, wherein the internal power voltage divider includes: a plurality of resistors connected in series between the second internal power voltage and a ground voltage, for dividing the second internal power voltage; and at least one fuse connected to at least one resistor in parallel among the plurality of the resistors.

2. The apparatus as recited in claim 1, further comprising a level controller for stabilizing the output voltage of the external power voltage divider, which is operated when the output voltage of the external power voltage divider reaches a predetermined level.

3. The apparatus as recited in claim 1, wherein the internal power voltage divider includes a plurality of MOS transistors connected in series between the second internal power voltage and the ground voltage, for dividing the second internal power voltage.

4. The apparatus as recited in claim 1, wherein the external power voltage divider includes a plurality of resistors connected in series between the external power voltage and the ground voltage.

5. The apparatus as recited in claim 1, wherein the external power voltage divider includes a resistor and an MOS diode connected to each other in series between the external power voltage and the ground voltage.

6. The apparatus as recited in claim 5, wherein the external power voltage detector activates the detection signal when the output voltage of the external power voltage divider makes the MOS diode turned on.

7. A circuit for generating a power up signal, comprising:
an external power voltage divider for dividing a magnitude of an external power voltage so as to output the divided external power voltage;
an external power voltage detector for activating a detection signal when the output voltage of the external power voltage divider reaches a preset level; and
a power up signal generator for outputting a power up signal according to the detection signal and a first internal power voltage, wherein the power up signal generator include:
a pull-up unit for pulling-up a node for outputting the power up signal
a pull-down unit for pulling-down the node for outputting the power up signal; and
a control unit arranged between the pull-up unit and the pull-down unit to connect the first pull-up unit to the node in response to the first internal power voltage.

8. The apparatus as recited in claim 7, further comprising a level controller for stabilizing the output voltage of the external power voltage divider, which is operated when the output voltage of the external power voltage divider reaches a predetermined level.

9. The apparatus as recited in claim 7, wherein the power up signal generator includes an internal power voltage divider for dividing a second internal power voltage so as to output the divided second internal power voltage as the first internal power voltage.

10. The apparatus as recited in claim 9, wherein the internal power voltage divider includes:
a plurality of resistors connected in series between the second internal power voltage and a ground voltage, for dividing the second internal power voltage; and
at least one fuse connected to at least one resistor in parallel among the plurality of the resistors.

11. The apparatus as recited in claim 10, wherein the internal power voltage divider includes a plurality of MOS transistors connected in series between the second internal power voltage and the ground voltage, for dividing the second internal power voltage.

12. The apparatus as recited in claim 11, wherein the external power voltage divider includes a resistor and an MOS diode connected to each other in series between the external power voltage and the ground voltage.

13. The apparatus as recited in claim 12, wherein the external power voltage detector activates the detection signal when the output voltage of the external power voltage divider makes the MOS diode turned on.

* * * * *